(12) United States Patent
Shinohe

(10) Patent No.: US 7,923,371 B2
(45) Date of Patent: Apr. 12, 2011

(54) METHOD OF MANUFACTURING SEMICONDUCTOR DEVICE HAVING CONTACT PLUGS

(75) Inventor: Masahito Shinohe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 12/405,482

(22) Filed: Mar. 17, 2009

(65) Prior Publication Data

US 2009/0250740 A1   Oct. 8, 2009

(30) Foreign Application Priority Data

Apr. 2, 2008   (JP) .................................. 2008-096149

(51) Int. Cl.
*H01L 21/44* (2006.01)

(52) U.S. Cl. ................ 438/669; 257/773; 257/E21.658; 438/666

(58) Field of Classification Search .................. 257/573, 257/773, E21.658; 438/283, 597, 637, 666, 438/669, 671, 672
See application file for complete search history.

(56) References Cited

U.S. PATENT DOCUMENTS

| 2006/0276032 | A1* | 12/2006 | Arakawa et al. | ............... 438/637 |
| 2008/0113511 | A1* | 5/2008 | Park et al. | ...................... 438/692 |
| 2008/0164528 | A1* | 7/2008 | Cohen et al. | ................... 257/365 |
| 2009/0316467 | A1* | 12/2009 | Liu | ............................... 365/105 |
| 2010/0047984 | A1* | 2/2010 | Cohen et al. | ................... 438/283 |

FOREIGN PATENT DOCUMENTS

JP   11-330238   11/1999

* cited by examiner

*Primary Examiner* — Thao X Le
*Assistant Examiner* — William F Kraig
(74) *Attorney, Agent, or Firm* — Finnegan, Henderson, Farabow, Garrett & Dunner, L.L.P.

(57) ABSTRACT

A semiconductor device has a semiconductor substrate in which a plurality of device regions and a plurality of device isolation regions are alternately formed to extend in a first direction; and a plurality of contact plugs formed on the semiconductor substrate, connected to the device regions and arranged on the semiconductor substrate in a zigzag pattern in a second direction perpendicular to the first direction, wherein the contact plugs have a rectangular cross section.

7 Claims, 12 Drawing Sheets

METHOD OF MANUFACTURING SEMICONDUCTOR DEVICE HAVING CONTACT PLUGS

CROSS-REFERENCE TO RELATED APPLICATION

This application is based upon and claims the benefit of priority from the prior Japanese Patent Application No. 2008-96149, filed on Apr. 2, 2008, the entire contents of which are incorporated herein by reference.

BACKGROUND OF THE INVENTION

1. Field of the Invention

The present invention relates to a method of manufacturing a semiconductor device that is intended to form a contact plug in an interlayer insulating film.

2. Background Art

For example, flash memory devices, such as NAND flash memories, can retain data even after the power supply is turned off. Therefore, the flash memory devices are widely used as multimedia cards.

Some of the flash memory devices have a matrix array of stacked gate electrodes formed on a semiconductor substrate with a gate insulating film interposed therebetween and thus contain a large number of memory cells and select gate transistors. These flash memory devices are increased in integration density in this way.

In general, flash memory devices have gate electrodes (a floating gate electrode and a control gate electrode) and a gate insulating film interposed therebetween that are formed on a semiconductor substrate.

Recently, there is a remarkable demand for increased write and erase speed of the memory cells. To increase the write and erase speed of the memory cells, the resistance of the control gate electrode has to be reduced. To achieve the reduction of the resistance of the control gate electrode, according to a method proposed, an alloy of a metal having a low resistance, such as cobalt, is used for the alloy layer formed on the control gate electrode.

In formation of the alloy layer, it is difficult to use a high-temperature thermal processing or the like. Therefore, a film of a metal having low resistance is formed on the base layer of the control gate electrode, and the base layer is divided before alloying. Then, in the period between the division and the alloying, an insulating film is formed between memory cells and between select gate transistors.

However, in some case, the insulating film is formed stepwise by stacking an oxide film as a side wall spacer and a nitride film as an etching stopper for forming a contact plug.

In this case, as the insulating film becomes thicker, an adequate space cannot be ensured between gate electrodes (in particular, between select gate transistors), which are required to be downsized. Thus, it is difficult to form a contact plug (a contact plug for a bit line, for example) having an adequate diameter between the select gate transistors.

In addition, the recent trend of downsizing has led to higher aspect ratio, and formation of the contact hole has become more difficult, so that the occurrence rate of insufficient contact holes has increased. In addition, although the half pitch of the cell array and the space between select gate transistors have to be reduced in order to reduce the chip area to achieve downsizing, the latter task is difficult because of the problem of contact plug formation described above.

In particular, the degree of downsizing of the contact hole depends on the exposure and resolution capability and the contact forming technique. Therefore, in the present circumstances, the limit of the exposure and resolution capability is equivalent to the limit of downsizing of contacts.

According to a conventional method of manufacturing a semiconductor device, an interlayer insulating film is etched using a first conductive film as a mask to form a contact hole, a second conductive film is formed to fill the contact hole, and the second conductive film is partially removed by chemical mechanical polishing (CMP) to form a connection pad (see Japanese Patent Laid-Open No. 11-330238, for example).

According to the conventional method of manufacturing a semiconductor device, etching of the contact plug due to misalignment is prevented in a lithography step, thereby preventing increase of the contact resistance.

However, even the conventional method of manufacturing a semiconductor device cannot form a contact plug that is smaller than the limit of the exposure and resolution capability of the contact hole.

SUMMARY OF THE INVENTION

According to one aspect of the present invention, there is provided: A method of manufacturing a semiconductor device having contact plugs in an interlayer insulating film formed over a semiconductor substrate, comprising:

forming a groove that penetrates through the interlayer insulating film;

forming conductive films on two opposite side surfaces of the groove;

depositing a first insulating film on the interlayer insulating film and on upper surfaces of the conductive films, and filling the groove having the conductive films with the first insulating film;

forming resist patterns on the first insulating film on the conductive films that are to form the contact plugs;

etching the first insulating film by using the resist patterns as a mask;

forming gaps by removing of the conductive films that are exposed by the etching; and filling the gaps with a second insulating film.

According to other aspect of the present invention, there is provided: a semiconductor device, comprising:

a semiconductor substrate in which a plurality of device regions and a plurality of device isolation regions are alternately formed to extend in a first direction; and a plurality of contact plugs formed on the semiconductor substrate, connected to the device regions and arranged on the semiconductor substrate in a zigzag pattern in a second direction perpendicular to the first direction, wherein the contact plugs have a rectangular cross section.

According to further aspect of the present invention, there is provided: a method of manufacturing a semiconductor device having a contact plug in an interlayer insulating film formed over a semiconductor substrate, comprising:

forming a groove that penetrates through the interlayer insulating film;

forming conductive films on two opposite side surfaces of the groove by depositing a conductive film on top of the interlayer insulating film and in the groove and removing the conductive film on top of the interlayer insulating film and on the bottom of the groove;

depositing a first insulating film on the interlayer insulating film and filling the groove having the conductive films deposited therein with the first insulating film;

forming a resist pattern on the first insulating film on the conductive film formed on one side surface of the groove that is to form the contact plug;

exposing the upper surface of the conductive film formed on the other side surface of the groove by selectively removing the first insulating film by etching using the resist pattern as a mask;

selectively removing the upper surface of the conductive film is exposed by etching; and filling a gap formed by removal of the conductive film with a second insulating film.

DETAILED DESCRIPTION

In the following, there will be described an example in which the semiconductor device to which the present invention is applied is a NAND flash memory. However, the present invention can equally be applied to other semiconductor devices, such as a NOR flash memory.

In the following, an embodiment of the present invention will be described with reference to the drawings.

First Embodiment

Figure 1:
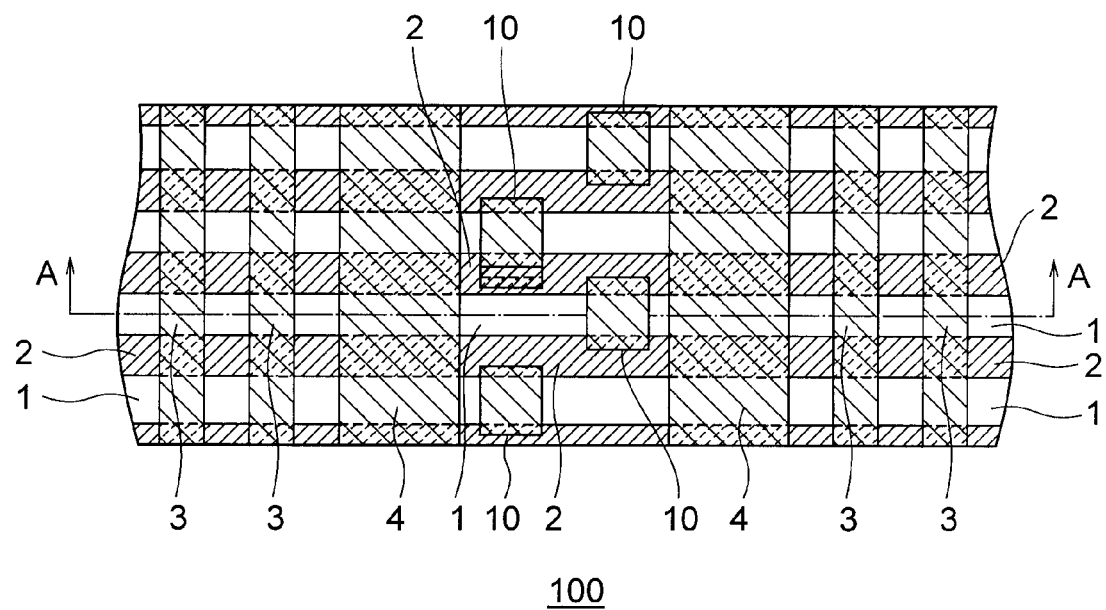
FIG. 1 is a plan view partially showing a configuration of a NAND flash memory 100 according to a first embodiment of the present invention, which is an aspect of the present invention.
Figure 2:
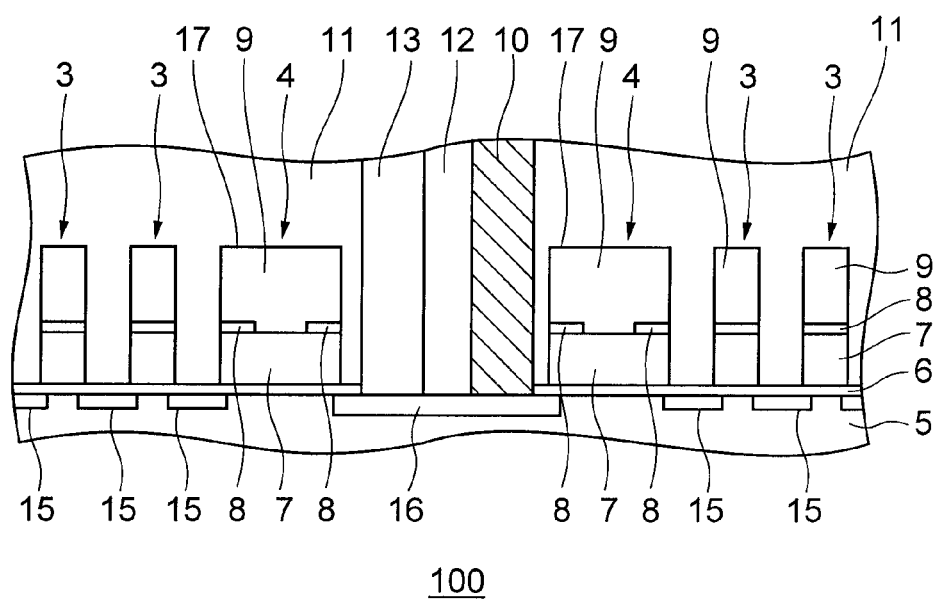
FIG. 2 is a cross-sectional view of the NAND flash memory 100 taken along the line A-A in FIG. 1.

FIG. 1 is a plan view partially showing a configuration of a NAND flash memory 100 according to a first embodiment of the present invention, which is an aspect of the present invention. FIG. 2 is a cross-sectional view of the NAND flash memory 100 taken along the line A-A in FIG. 1.

As shown in FIGS. 1 and 2, in a memory area of the NAND flash memory 100, a plurality of device regions 1 and a plurality of device isolation regions 2 are alternately formed on a semiconductor substrate to extend in a first direction. In each device region 1, a plurality of memory cells 3 connected in series with each other is formed to form a memory cell unit. The device isolation region 2 is formed by a shallow trench isolation (STI) film, for example.

For example, the NAND flash memory 100 has two select gate transistors 4 for every 16 or 32 gate wires of the transistors of the memory cells 3.

The memory cell 3 has a diffusion region 15 formed in a semiconductor substrate 5, a gate insulating film 6 formed on the semiconductor substrate 5, a conductive film (floating gate) 7 formed on the gate insulating film 6, a gate insulating film 8 formed on the conductive film 7, and a conductive film (control gate) 9 formed on the gate insulating film 8.

The select gate transistor 4 has a diffusion region 15, a diffusion region (drain region) 16, a gate insulating film 6, and a select gate 17 composed of conductive films 7 and 9.

In addition, an interlayer insulating film 11 is formed on the semiconductor substrate 5 to insulate the memory cells 3 from the adjacent memory cell(s) 3 and from the adjacent select gate transistor 4.

The adjacent select gate transistors 4 are insulated from each other by the interlayer insulating film 11, an interlayer insulating film (first insulating film) 12 and an interlayer insulating film (second insulating film) 13.

In addition, between adjacent select gate transistors 4, a plurality of contact plugs 10 that are substantially rectangular in cross section and connected to an upper-layer bit line (not shown) and to the diffusion regions 16 formed in the device regions 1 in a one-to-one relationship are formed. That is, the contact plugs 10 are connected to the select gate transistors 4 via the diffusion regions 16. The rectangular cross section of the contact plug 10 has a side parallel to the first direction and a side parallel to a second direction perpendicular to the first direction.

On the semiconductor substrate 5, the contact plugs 10 are arranged in a zigzag pattern in the second direction in which the device regions 1 and the device isolation regions 2 are arranged.

Next, there will be described a method of manufacturing a semiconductor device that is intended to form the contact plug 10 of the NAND flash memory 100 configured as described above.

In the following, the contact plug 10 of the NAND flash memory 100 and a periphery thereof will be particularly descried.

FIGS. 3A to 11A are plan views showing different steps of a method of manufacturing a semiconductor device according to the first embodiment of the present invention, which is an aspect of the present invention. FIGS. 3B to 11B are cross-sectional views taken along the line X-X in FIGS. 3A to 11A, respectively. FIG. 12 is a diagram showing an exemplary resist configuration.

Figure 3A:
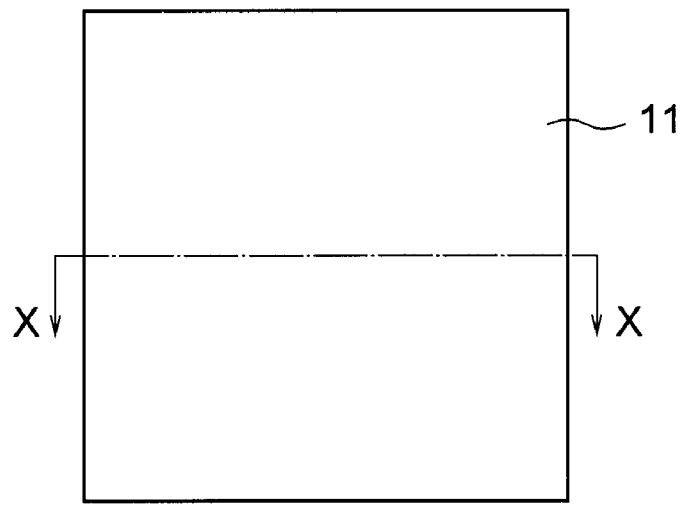
FIG. 3A is a plan view showing a step of a method of manufacturing a semiconductor device according to the first embodiment of the present invention, which is an aspect of the present invention.
Figure 3B:
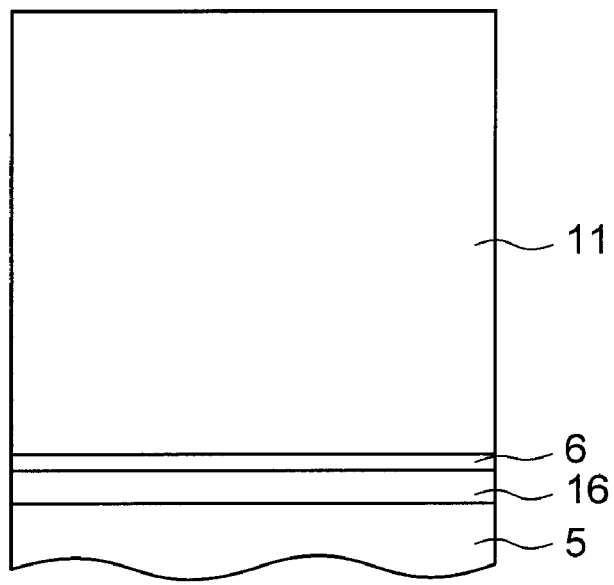
FIG. 3B is a cross-sectional view taken along the line X-X in FIG. 3A.

First, a gate insulating film 6 is formed on a semiconductor substrate 5 (a diffusion region 16). Then, other components of the NAND flash memory 100, such as memory cells and select gate transistors, are formed (not shown). Then, an interlayer insulating film 11 is formed on the gate insulating film 6 (FIGS. 3A and 3B). Note that, as shown in FIG. 2, the interlayer insulating film 11 covers the memory cells 3 and the select gate transistors 4 of the NAND flash memory 100.

Figure 4A:
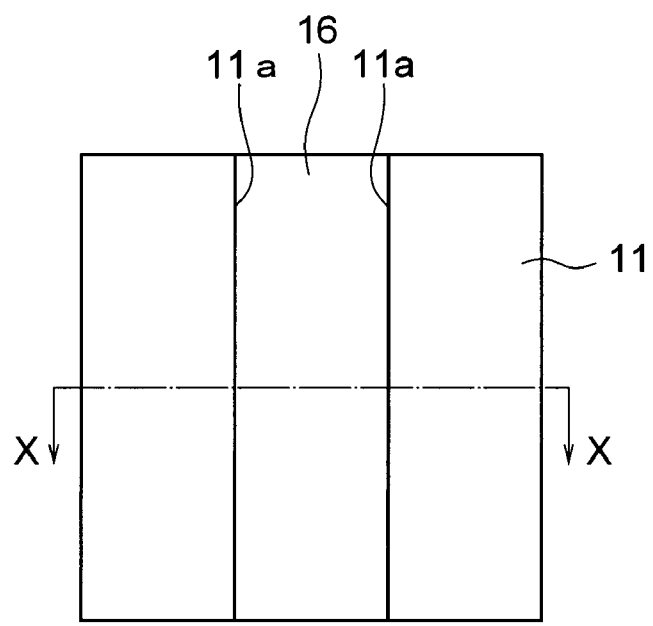
FIG. 4A is a plan view showing a step of a method of manufacturing a semiconductor device according to the first embodiment of the present invention, is continuous from FIG. 3A.
Figure 4B:
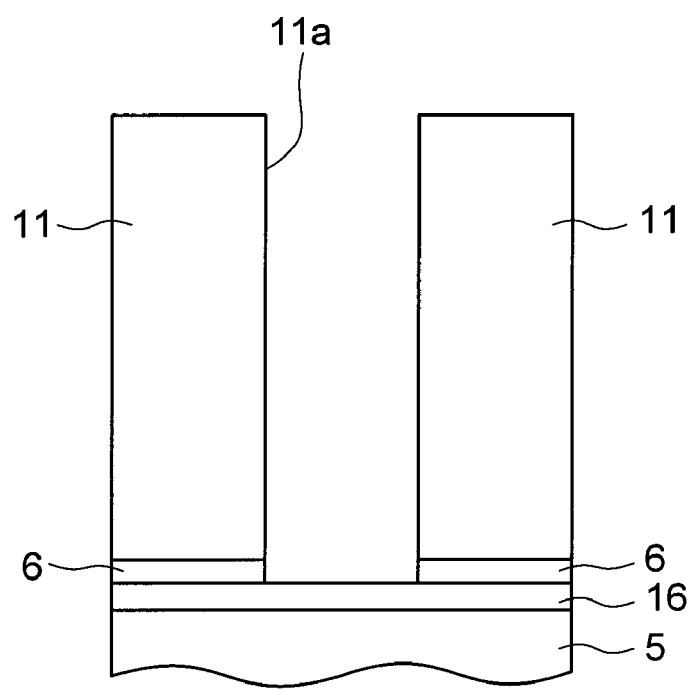
FIG. 4B is a cross-sectional view taken along the line X-X in FIG. 4A, is continuous from FIG. 3B.

Then, as shown in FIGS. 4A and 4B, a groove 11a extending in a direction perpendicular to the direction in which the device regions 1 and the device isolation regions 2 in FIG. 1 are arranged is formed to penetrate through the interlayer insulating film 11 to a diffusion region 16 (semiconductor substrate 5). The final width of the groove 11a is equal to or larger than the total width of two contact plugs, so that the groove 11a can be formed with a sufficient processing margin.

Figure 5A:
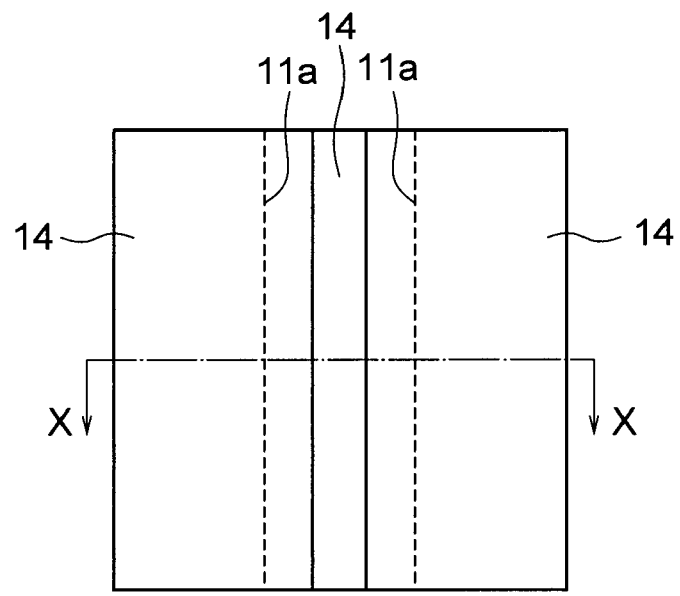
FIG. 5A is a plan view showing a step of a method of manufacturing a semiconductor device according to the first embodiment of the present invention, is continuous from FIG. 4A.
Figure 5B:
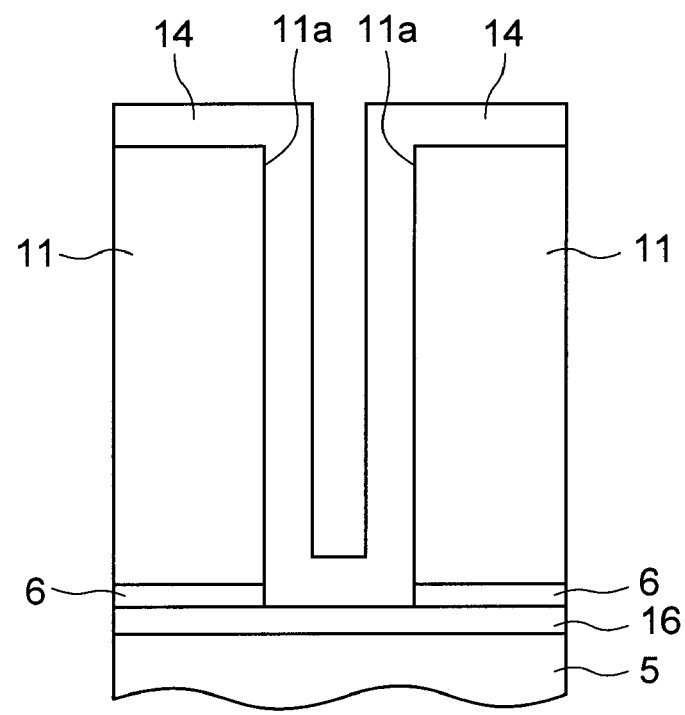
FIG. 5B is a cross-sectional view taken along the line X-X in FIG. 5A, is continuous from FIG. 4B.

Then, as shown in FIGS. 5A and 5B, a conductive film 14 is deposited on top of the interlayer insulating film 11 and on the inner surface of the groove 11a. The conductive film 14 is a film of amorphous silicon doped with an impurity (P, for example), for example. The conductive film 14 is deposited by vapor deposition, low pressure chemical vapor deposition (LPCVD), atomic layer deposition (ALD), or the like.

Figure 6A:
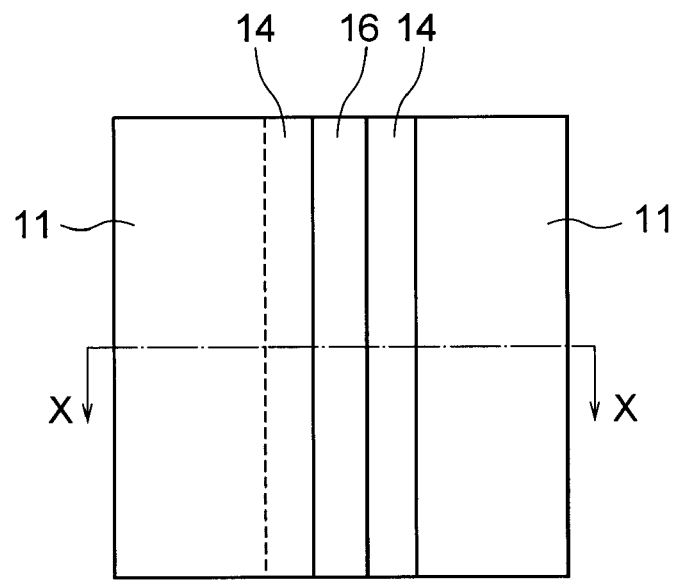
FIG. 6A is a plan view showing a step of a method of manufacturing a semiconductor device according to the first embodiment of the present invention, is continuous from FIG. 5A.
Figure 6B:
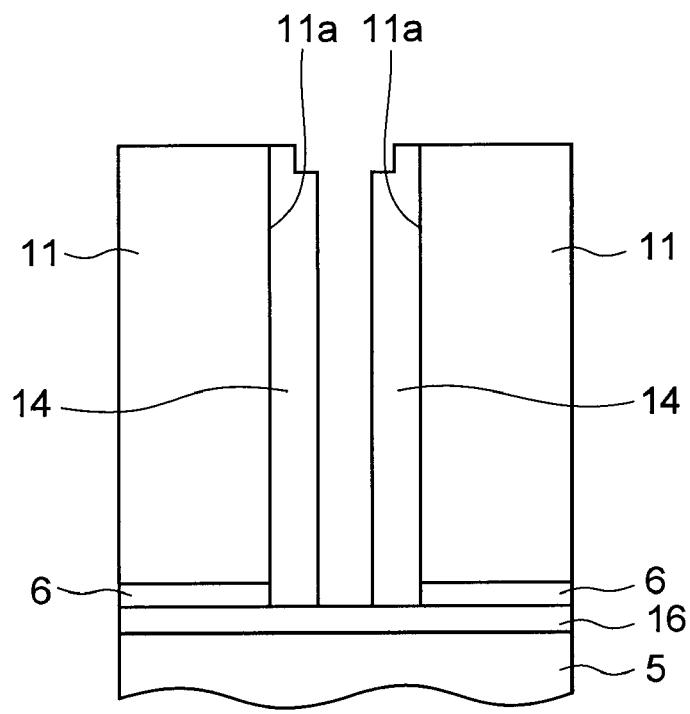
FIG. 6B is a cross-sectional view taken along the line X-X in FIG. 6A, is continuous from FIG. 5B.

Then, as shown in FIGS. 6A and 6B, the conductive film 14 on top of the interlayer insulating film 11 and a part of the conductive film 14 on the diffusion region 16 are removed by reactive ion etching (RIE), for example. In this way, conductive films 14 continuously extending from the upper surface to the lower surface of the interlayer insulating film 11 (or connected to the diffusion region 16) are formed on two opposite side surfaces of the groove 11a.

Figure 7A:
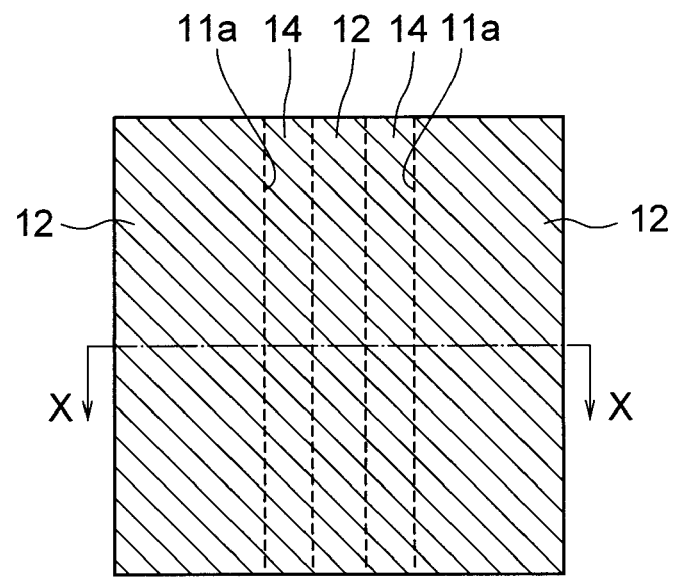
FIG. 7A is a plan view showing a step of a method of manufacturing a semiconductor device according to the first embodiment of the present invention, is continuous from FIG. 6A.
Figure 7B:
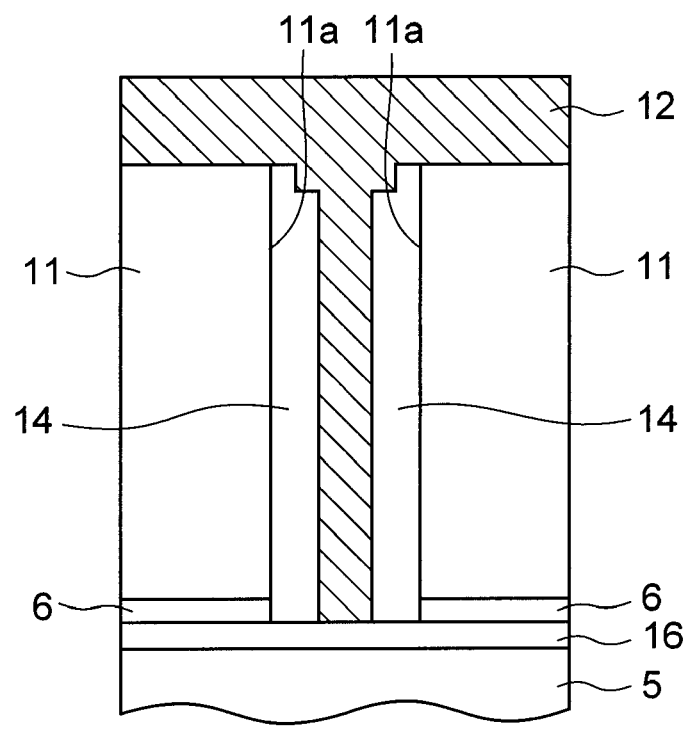
FIG. 7B is a cross-sectional view taken along the line X-X in FIG. 7A, is continuous from FIG. 6B.

Then, as shown in FIGS. 7A and 7B, a first insulating film 12 is deposited over the entire surface. More specifically, the first insulating film 12 is deposited to fill the groove 11a having the conductive films 14 deposited therein and cover the top of the interlayer insulating film 11. The first insulating film 12 is a film of tetra ethyl ortho silicate (TEOS), for example. The TEOS film is deposited by LPCVD, for example.

Then, the first insulating film 12 on a part of the conductive film 14 on one side surface of the groove 11a that is to form a contact plug 10 is covered with a resist pattern 18. Then, the first insulating film 12 is selectively removed by etching using the resist pattern 18 as a mask. In this way, an upper surface 14a of the conductive film 14 on the other side surface of the groove 11a is exposed (see FIGS. 8A and 8B).

Figure 8A:
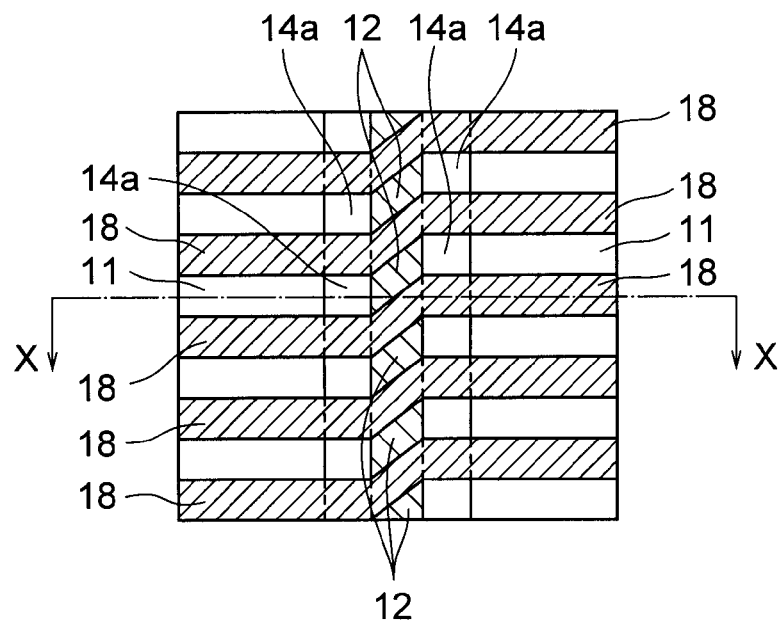
FIG. 8A is a plan view showing a step of a method of manufacturing a semiconductor device according to the first embodiment of the present invention, is continuous from FIG. 7A.
Figure 8B:
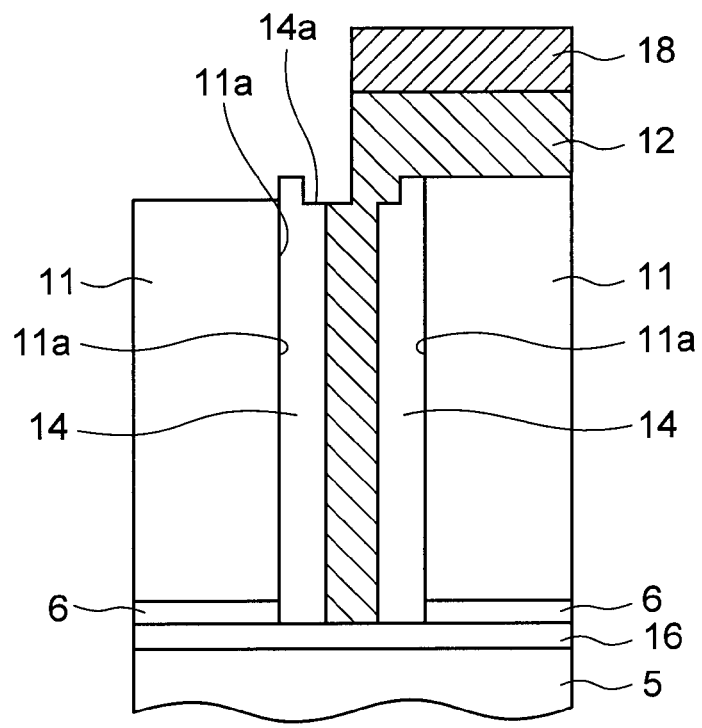
FIG. 8B is a cross-sectional view taken along the line X-X in FIG. 8A, is continuous from FIG. 7B.

Here, as shown in FIG. 8A, parts to form contact plugs 10 are arranged in a zigzag pattern along the groove 11a (in the direction perpendicular to the direction in which the device regions are arranged).

Thus, resist patterns 18 are arranged in a zigzag pattern in the same direction to cover the first insulating film 12 on the parts of the conductive film 14 to form contact plugs 10.

In particular, the resist patterns 18 are formed to cover the first insulating film 12 on the parts of the conductive film 14 to form contact plugs 10 by extending from upside of the interlayer insulating film 11 to upside of the part of the first insulating film 12 in the groove 11a. Therefore, the resist patterns 18 have an enough margin to cover the first insulating film 12 on the parts of the conductive film 14 to form contact plugs 10 even when the resist patterns 18 are misaligned in the direction perpendicular to the direction of the groove 11a.

In addition, the resist patterns 18 arranged in a zigzag pattern are formed to be continuous on the first insulating film 12. In particular, in this embodiment, the resist patterns 18 arranged in a zigzag pattern are connected by oblique parts on the first insulating film 12. However, as shown in FIG. 12, adjacent resist patterns 18 arranged in a zigzag pattern may be connected to each other at the ends thereof on the first insulating film 12.

Then, the resist patterns 18 are subjected to ashing and then removed with a chemical.

Figure 9A:
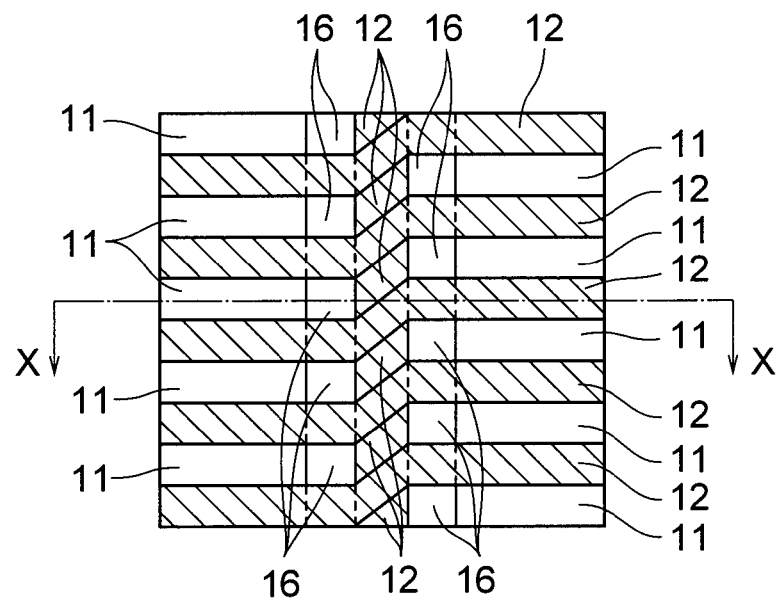
FIG. 9A is a plan view showing a step of a method of manufacturing a semiconductor device according to the first embodiment of the present invention, is continuous from FIG. 8A.
Figure 9B:
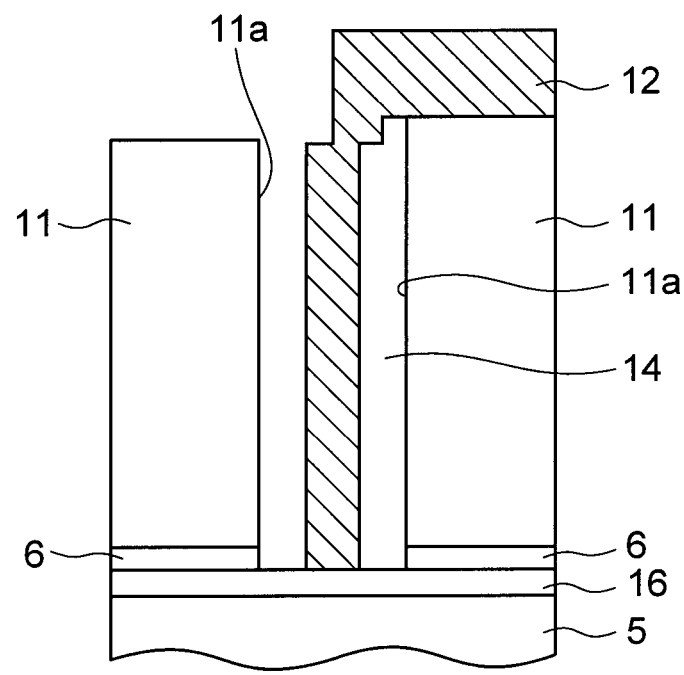
FIG. 9B is a cross-sectional view taken along the line X-X in FIG. 9A, is continuous from FIG. 8B.

Then, as shown in FIGS. 9A and 9B, the conductive film 14 the upper surface 14a of which is exposed is selectively removed by etching using the remaining first insulating film 12 as a mask.

Figure 10A:
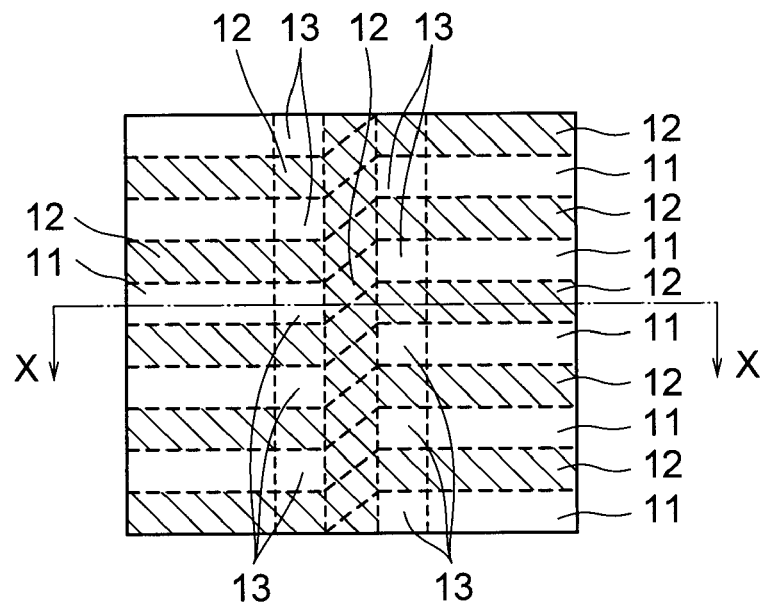
FIG. 10A is a plan view showing a step of a method of manufacturing a semiconductor device according to the first embodiment of the present invention, is continuous from FIG. 9A.
Figure 10B:
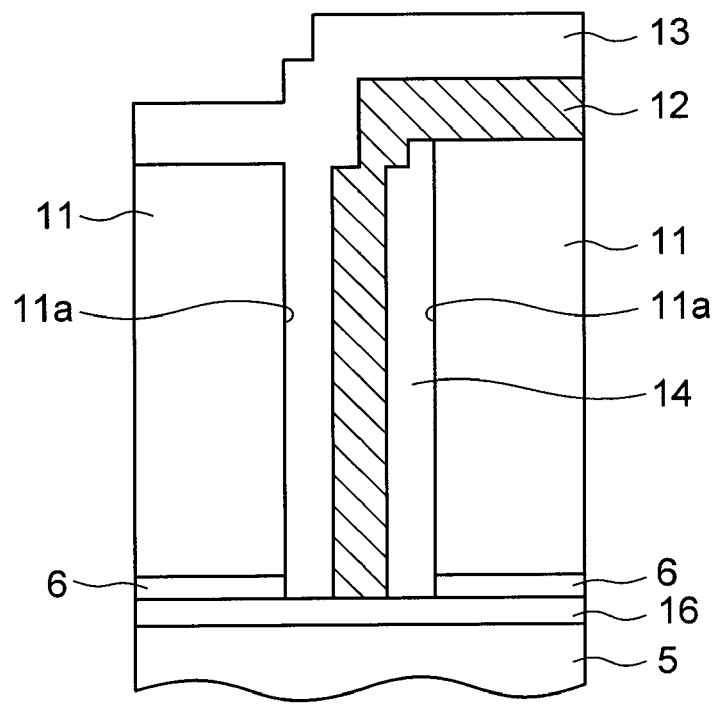
FIG. 10B is a cross-sectional view taken along the line X-X in FIG. 10A, is continuous from FIG. 9B.

Then, as shown in FIGS. 10A and 10B, a second insulating film 13 is deposited over the entire surface. That is, the gap formed by removal of the conductive film 14 is filled with the second insulating film 13.

Figure 11A:
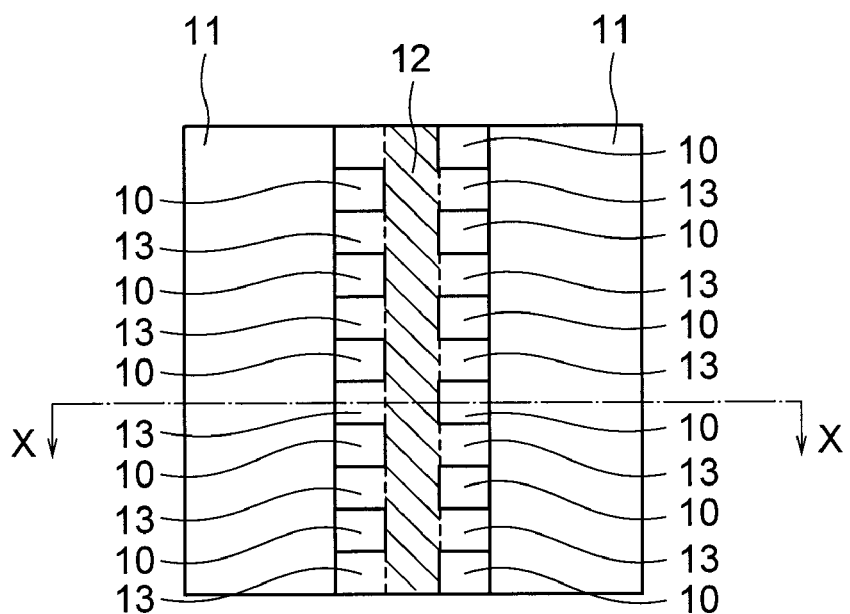
FIG. 11A is a plan view showing a step of a method of manufacturing a semiconductor device according to the first embodiment of the present invention, is continuous from FIG. 10A.
Figure 11B:
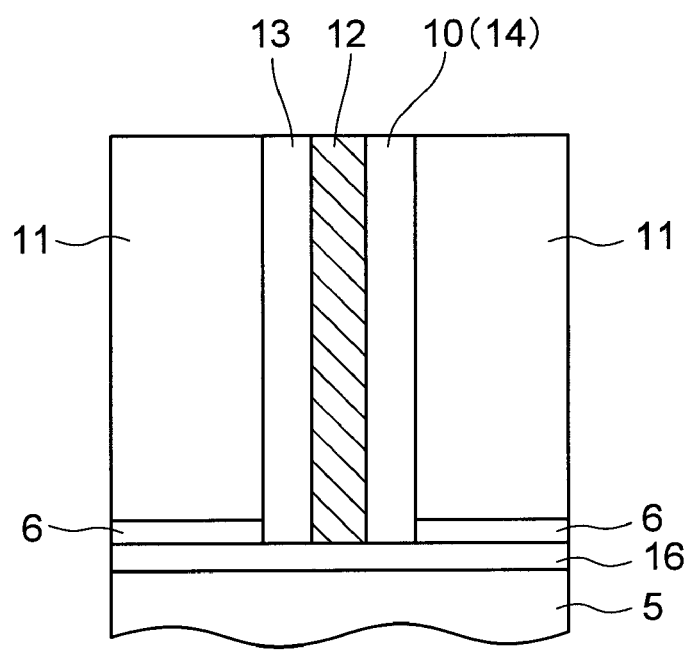
FIG. 11B is a cross-sectional view taken along the line X-X in FIG. 11A, is continuous from FIG. 10B.
Figure 12:
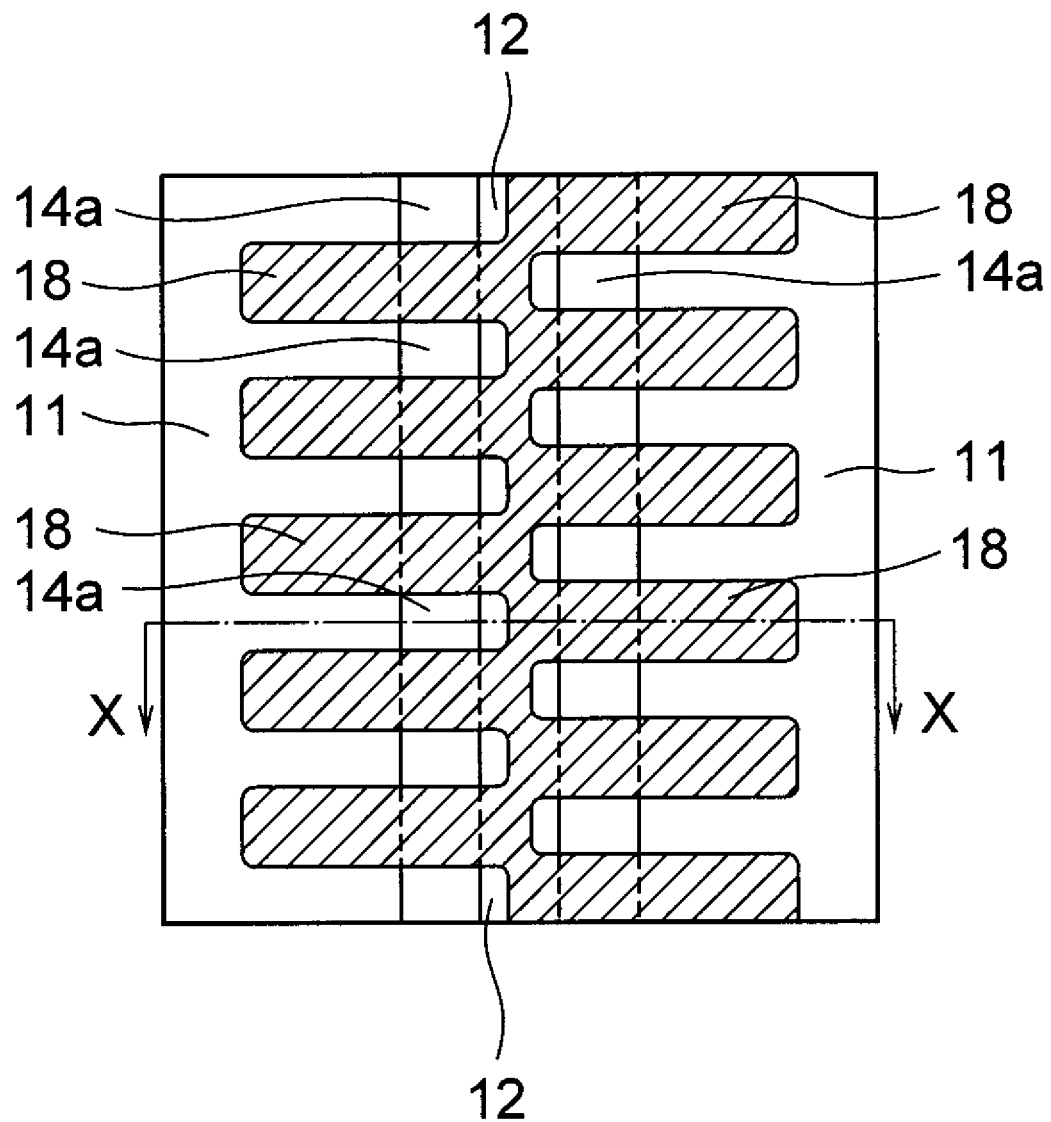
FIG. 12 is a diagram showing an exemplary resist configuration.

Then, as shown in FIGS. 11A and 11B, the upper part of the conductive film 14, the upper part of the first insulating film 12 and the upper part of the second insulating film 13 are planarized by CMP, for example. Note that a thin nitride film (not shown), for example, is formed on the interlayer insulating film 11 as a CMP stopper film.

The contact plug shown in FIG. 2 described above is completed by planarizing the conductive film 14 in this way. As shown in FIG. 11B, each contact plug 10 is connected to the diffusion region 16 of the adjacent select gate transistor 4.

Then, upper layer wiring (not shown) or the like is formed to connect the contact plugs 10 to a bit line (not shown), thereby completing the NAND flash memory 100.

As described earlier, the width (thickness) of the conductive film 14 to form the contact plug 10 in the direction parallel to the direction in which the device regions 1 are arranged is controlled by using vapor deposition, LPCVD, ALD or the like.

This means that, compared with the case where the contact hole is formed by lithography, the width of the contact plug 10 in the direction parallel to the direction in which the device regions 1 are arranged can be reduced.

Furthermore, as described earlier, the width of the conductive film 14 in the direction perpendicular to the direction in which the device regions 1 are arranged depends on the lithography dimension of the line-and-space pattern. In general, the limit of the exposure and resolution capability of the line-and-space pattern is higher than the limit of the exposure and resolution capability of the contact hole.

Therefore, according to the method of manufacturing a semiconductor device described above, the contact plug 10 can have a smaller width in the direction perpendicular to the direction in which the device regions 1 are arranged than the case where the contact hole is formed by lithography.

Thus, the method of manufacturing a semiconductor device described above can form a contact plug that is smaller than the limit of the exposure and resolution capability of the contact hole.

As described above, in this embodiment, the resist patterns and the contact plugs are arranged in a zigzag pattern. It is noticed that, the resist patterns and the contact plugs may be arranged along only one side surface of the groove. In this case, similarly, the method of manufacturing a semiconductor device described above can form contact plugs that are smaller than the limit of the exposure and resolution capability of the contact hole.

Figure 13A:
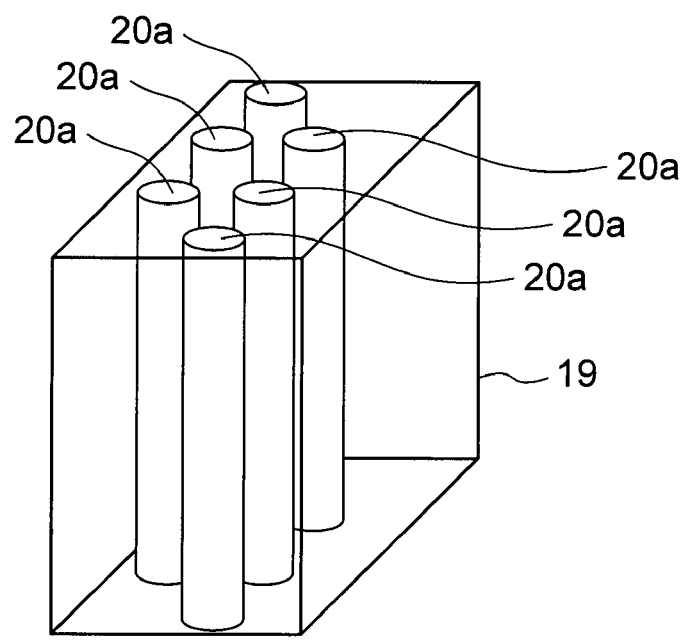
FIG. 13A is a perspective view of contact plugs 20a formed in an interlayer insulating film 19 between select gate transistors by a conventional method of manufacturing a semiconductor device.
Figure 13B:
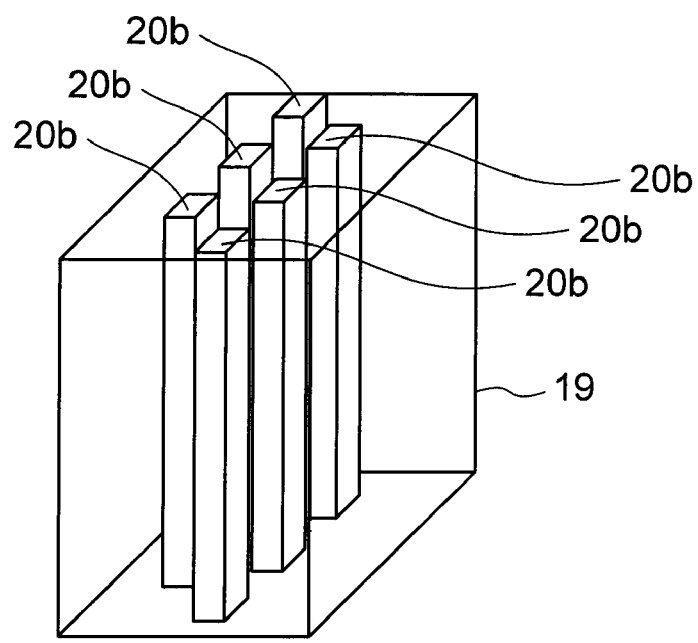
FIG. 13B is a perspective view of contact plugs 20b formed in an interlayer insulating film 19 between select gate transistors by the method of manufacturing a semiconductor device according to this embodiment.

FIG. 13A is a perspective view of contact plugs 20a formed in an interlayer insulating film 19 between select gate transistors by a conventional method of manufacturing a semiconductor device. FIG. 13B is a perspective view of contact plugs 20b formed in an interlayer insulating film 19 between select gate transistors by the method of manufacturing a semiconductor device according to this embodiment.

As shown in FIG. 13A, the contact plugs 20a formed by the conventional method of manufacturing a semiconductor device are formed by filling the contact holes with a conductive film. Therefore, the contact plugs 20a have a circular cross section.

On the other hand, as shown in FIG. 13B, the contact plugs 20b formed by the method of manufacturing a semiconductor device according to this embodiment have a rectangular cross section.

That is, the contact plugs 20a formed by the conventional method of manufacturing a semiconductor device and the contact plugs 20b formed by the method of manufacturing a semiconductor device according to this embodiment differ in shape.

As described above, according to the method of manufacturing a semiconductor device according to this embodiment, smaller contact plugs can be appropriately formed.

What is claimed is:

1. A method of manufacturing a semiconductor device having contact plugs in an interlayer insulating film formed over a semiconductor substrate, comprising:
    forming a groove that penetrates through the interlayer insulating film;
    forming conductive films on two opposite side surfaces of the groove;
    depositing a first insulating film on the interlayer insulating film and on upper surfaces of the conductive films, and filling the groove having the conductive films with the first insulating film;
    forming resist patterns on the first insulating film on the conductive films that are to form the contact plugs;
    etching the first insulating film by using the resist patterns as a mask;
    forming gaps by removing the conductive films that are exposed by the etching; and
    filling the gaps with a second insulating film.

2. The method of claim 1, wherein parts of the conductive films, which are to form contact plugs, are arranged in a zigzag pattern in the direction of the groove, and
    the resist patterns are arranged in a zigzag pattern in the direction.

3. The method of claim 2, wherein the resist patterns arranged in a zigzag pattern is formed to be continuous on the first insulating film.

4. The method of claim 1, wherein the conductive films are deposited by vapor deposition, low pressure chemical vapor deposition or atomic layer deposition.

5. The method of claim 1, wherein the resist patterns are formed on the first insulating film on the conductive film that is to form the contact plugs by extending from upside of the interlayer insulating film to upside of the first insulating film in the groove.

6. The method of claim 1, wherein the interlayer insulating film is disposed between adjacent select transistors of a NAND flash memory formed on the semiconductor substrate, and
    the contact plugs are connected to a diffusion region of the adjacent select transistors.

7. A method of manufacturing a semiconductor device having a contact plug in an interlayer insulating film formed over a semiconductor substrate, comprising:
    forming a groove that penetrates through the interlayer insulating film;
    forming conductive films on two opposite side surfaces of the groove by depositing a conductive film on top of the interlayer insulating film and in the groove and removing the conductive film on top of the interlayer insulating film and on the bottom of the groove;
    depositing a first insulating film on the interlayer insulating film and filling the groove having the conductive films deposited therein with the first insulating film;
    forming a resist pattern on the first insulating film on the conductive film formed on one side surface of the groove that is to form the contact plug;
    exposing the upper surface of the conductive film formed on the other side surface of the groove by selectively removing the first insulating film by etching using the resist pattern as a mask;
    selectively removing the upper surface of the conductive film that is exposed by the etching; and
    filling a gap formed by removal of the conductive film with a second insulating film.

\* \* \* \* \*